United States Patent
Li et al.

(10) Patent No.: US 10,340,354 B2
(45) Date of Patent: Jul. 2, 2019

(54) MANUFACTURING METHOD OF THIN-FILM TRANSISTOR (TFT) ARRAY SUBSTRATE

(71) Applicants: BOE TECHNOLOGY GROUP CO., LTD., Beijing (CN); BEIJING BOE DISPLAY TECHNOLOGY CO., LTD., Beijing (CN)

(72) Inventors: Liangliang Li, Beijing (CN); Huibin Guo, Beijing (CN); Zheng Liu, Beijing (CN); Shoukun Wang, Beijing (CN); Yuchun Feng, Beijing (CN)

(73) Assignees: BOE TECHNOLOGY GROUP CO., LTD., Beijing (CN); BEIJING BOE DISPLAY TECHNOLOGY CO., LTD., Beijing (CN)

(*) Notice: Subject to any disclaimer, the term of this patent is extended or adjusted under 35 U.S.C. 154(b) by 5 days.

(21) Appl. No.: 15/547,643
(22) PCT Filed: Jan. 19, 2017
(86) PCT No.: PCT/CN2017/071705
§ 371 (c)(1),
(2) Date: Jul. 31, 2017
(87) PCT Pub. No.: WO2017/185838
PCT Pub. Date: Nov. 2, 2017

(65) Prior Publication Data
US 2018/0122914 A1 May 3, 2018

(30) Foreign Application Priority Data
Apr. 28, 2016 (CN) .......................... 2016 1 0279966

(51) Int. Cl.
*H01L 29/45* (2006.01)
*H01L 21/77* (2017.01)
(Continued)

(52) U.S. Cl.
CPC .............. *H01L 29/45* (2013.01); *H01L 21/77* (2013.01); *H01L 27/127* (2013.01);
(Continued)

(58) Field of Classification Search
None
See application file for complete search history.

(56) References Cited

U.S. PATENT DOCUMENTS

2007/0131926 A1 6/2007 Lee et al.
2007/0284586 A1 12/2007 Park et al.
(Continued)

FOREIGN PATENT DOCUMENTS

CN 1979912 A 6/2007
CN 101013242 A 8/2007
(Continued)

OTHER PUBLICATIONS

The First Chinese Office Action dated Sep. 14, 2017: Appln. 201610279966.2.
(Continued)

*Primary Examiner* — Dung A. Le
(74) *Attorney, Agent, or Firm* — Ladas & Parry LLP

(57) ABSTRACT

A method of manufacturing a thin-film transistor (TFT) array substrate, including: forming a gate layer, a gate insulating layer, an oxide semiconductor layer, a source/drain electrode layer and a pixel electrode layer on a base substrate. The step of forming the source/drain electrode layer and the pixel electrode layer includes: forming a transparent conductive film and a first metallic film on the oxide semiconductor layer in sequence, to form a stack layer of the transparent conductive film and the first metallic film, in which the transparent conductive film contacts the oxide semiconductor layer; and forming source electrodes, drain electrodes and pixel electrodes by a single patterning process on the stack layer of the transparent conductive film and the first metallic film. One patterning process is saved, the production time is shortened, and the production cost is reduced.

15 Claims, 4 Drawing Sheets

(51) Int. Cl.
   *H01L 29/786*   (2006.01)
   *H01L 27/12*    (2006.01)
   *H01L 29/24*    (2006.01)
   *H01L 29/417*   (2006.01)
   *G02F 1/1368*   (2006.01)
   *G02F 1/1343*   (2006.01)

(52) U.S. Cl.
   CPC ...... *H01L 27/1225* (2013.01); *H01L 27/1288* (2013.01); *H01L 29/24* (2013.01); *H01L 29/41733* (2013.01); *H01L 29/786* (2013.01); *H01L 29/7869* (2013.01); *G02F 1/1368* (2013.01); *G02F 2001/13685* (2013.01); *G02F 2001/134318* (2013.01); *G02F 2201/121* (2013.01); *G02F 2201/123* (2013.01)

(56) References Cited

U.S. PATENT DOCUMENTS

| | | | | |
|---|---|---|---|---|
| 2010/0165227 | A1* | 7/2010 | Liu | H01L 29/78618 349/43 |
| 2010/0289977 | A1* | 11/2010 | Liu | G02F 1/1362 349/44 |
| 2011/0101459 | A1 | 5/2011 | Gan et al. | |
| 2013/0187164 | A1* | 7/2013 | Oshima | H01L 29/78693 257/59 |
| 2014/0273362 | A1* | 9/2014 | Gao | H01L 29/458 438/158 |
| 2016/0027818 | A1 | 1/2016 | Yoo et al. | |
| 2016/0358944 | A1 | 12/2016 | Yin et al. | |

FOREIGN PATENT DOCUMENTS

| | | |
|---|---|---|
| CN | 101079429 A | 11/2007 |
| CN | 102637648 A | 8/2012 |
| CN | 103715094 A | 4/2014 |
| CN | 104393001 A | 3/2015 |
| CN | 104992947 A | 10/2015 |
| CN | 105762112 A | 7/2016 |

OTHER PUBLICATIONS

The Second Chinese Office Acton dated Jan. 11, 2018: Appln. No. 201610279966.2.

The International Search Report and Written Opinion dated Apr. 11, 2017; PCT/CN2017/071705.

* cited by examiner

Forming a transparent conductive film and a first metallic film in sequence on an oxide semiconductor layer, so as to form a stack layer of the transparent conductive film and the first metallic film, in which the transparent conductive film contacts the oxide semiconductor layer.

Forming source electrodes, drain electrodes, and pixel electrodes by performing a single patterning process on the stack layer of the transparent conductive film and the first metallic film.

FIG. 1

Coating photoresist on a first metallic film.

Performing exposure and development on the photoresist and forming photoresist-completely-retained regions, photoresist-partly-retained regions and photoresist-removed regions.

Removing a transparent conductive film and the first metallic film in the photoresist-removed regions by a first etching process.

Removing the photoresist in the photoresist-partly-retained regions by an ashing process.

Removing the first metallic film in the photoresist-partly-retained regions by a second etching process, and forming pixel electrodes.

Stripping off the photoresist in the photoresist-completely-retained regions and forming source electrodes and drain electrodes.

FIG. 2

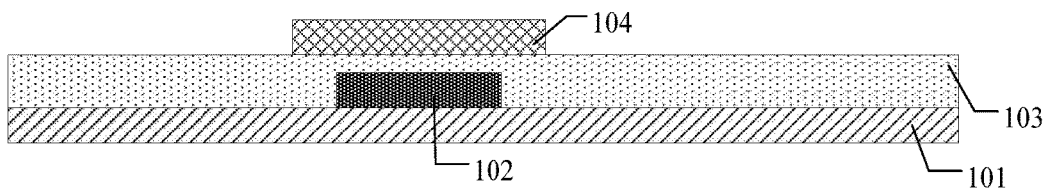

FIG. 3

MANUFACTURING METHOD OF THIN-FILM TRANSISTOR (TFT) ARRAY SUBSTRATE

TECHNICAL FIELD

Embodiments of the present disclosure relate to a thin-film transistor (TFT) array substrate, a manufacturing method thereof, and a display device.

BACKGROUND

Oxide semiconductor TFTs have advantages, such as high migration rate, good stability, and, simple manufacturing process. Oxide semiconductor materials represented by indium gallium zinc oxide (IGZO) are widely applied in the fields, such as thin-film transistor liquid crystal displays (TFT-LCDs), and active matrix organic light-emitting diode (AMOLED) panels.

Currently, the structure of the oxide semiconductor TFTs mainly includes etching barrier type, back channel etching type and coplanar type. The manufacturing process of metal oxide IGZO TFTs of back channel etching type is relatively simple, omits one photolithography process compared with the etching barrier type, and can reduce the equipment investment and improve the production efficiency, so the back channel etching type is a research hotspot recently.

SUMMARY

At least one embodiment of the present disclosure provides a method of manufacturing a thin-film transistor (TFT) array substrate, comprising: forming a gate layer, a gate insulating layer, an oxide semiconductor layer, a source/drain electrode layer and a transparent conductive layer on a base substrate. The forming of the source/drain electrode layer and the transparent conductive layer includes: forming a transparent conductive film and a first metallic film on the oxide semiconductor layer in sequence, to form a stack layer of the transparent conductive film and the first metallic film, the transparent conductive film contacting the oxide semiconductor layer; and forming source electrodes, drain electrodes, and pixel electrodes by performing a single patterning process on the stack layer of the transparent conductive film and the first metallic film.

For example, in a method of manufacturing the TFT array substrate provided by an embodiment of the present disclosure, the first metallic film is made from a copper (Cu)-based metal.

For example, in a method of manufacturing the TFT array substrate provided by an embodiment of the present disclosure, the Cu-based metal is Cu, copper-zinc alloy (CuZn), copper-nickel alloy (CuNi), or copper-zinc-nickel alloy (CuZnNi).

For example, in a method of manufacturing the TFT array substrate provided by an embodiment of the present disclosure, the transparent conductive film is made from a material including at least one of indium tin oxide (ITO), indium zinc oxide (IZO), gallium zinc oxide (GZO), or carbon nanotubes.

For example, in a method of manufacturing the TFT array substrate provided by an embodiment of the present disclosure, the oxide semiconductor layer is made from a material including at least one of indium gallium zinc oxide (IGZO), IZO, zinc oxide (ZnO), or GZO.

For example, in a method of manufacturing the TFT array substrate provided by an embodiment of the present disclosure, further comprising: forming a protective layer film on the first metallic film, and forming the pixel electrodes, the source electrodes, the drain electrodes, and the protective layer by performing a single patterning process on the transparent conductive film, the first metallic film, and the protective layer film.

For example, in a method of manufacturing the TFT array substrate provided by an embodiment of the present disclosure, the protective layer film includes at least one of ITO, IZO, IGZO, GZO, or carbon nanotube conductive films.

For example, in a method of manufacturing the TFT array substrate provided by an embodiment of the present disclosure, the single patterning process includes a photolithography process using a gray-tone mask, or a half-tone mask.

For example, in a method of manufacturing the TFT array substrate provided by an embodiment of the present disclosure, the single patterning process includes: coating photoresist on the first metallic film; forming photoresist-completely-retained regions, photoresist-partly-retained regions and photoresist-removed regions by performing an exposure process, and a developing process on the photoresist; removing the transparent conductive film and the first metallic film in the photoresist-removed regions by a first etching process; removing the photoresist in the photoresist-partly-retained regions by an ashing process; removing the first metallic film in the photoresist-partly-retained regions by a second etching process, and forming the pixel electrodes; and stripping off the photoresist in the photoresist-completely-retained regions, and forming the source electrodes and the drain electrodes. The photoresist-completely-retained regions correspond to regions where the source electrodes and the drain electrodes are formed; the photoresist-partly-retained regions correspond to regions where the pixel electrodes are formed; and the photoresist-removed regions are regions other than the photoresist-completely-retained regions and the photoresist-partly-retained regions.

For example, in a method of manufacturing the TFT array substrate provided by an embodiment of the present disclosure, a first etching solution used in the first etching process and a second etching solution used in the second etching process include hydrogen peroxide ($H_2O_2$), and a concentration of $H_2O_2$ in the first etching solution is greater than that of $H_2O_2$ in the second etching solution.

For example, in a method of manufacturing the TFT array substrate provided by an embodiment of the present disclosure, TFTs are bottom-gate TFTs; and the gate layer, the gate insulating layer, and the oxide semiconductor layer are sequentially formed before the pixel electrodes, the source electrodes and the drain electrodes are formed.

For example, in a method of manufacturing the TFT array substrate provided by an embodiment of the present disclosure, the TFTs are top-gate TFTs; the oxide semiconductor layer is formed before the pixel electrodes, the source electrodes, the drain electrodes, and the protective layer are formed; and the gate insulating layer and the gate layer are sequentially formed after the pixel electrodes, the source electrodes, the drain electrodes, and the oxide semiconductor layer are formed.

For example, in a method of manufacturing the TFT array substrate provided by an embodiment of the present disclosure, further comprising forming a passivation layer to cover the pixel electrodes, the source electrodes, the drain electrodes, the gate layer, the gate insulating layer, and the oxide semiconductor layer.

For example, in a method of manufacturing the TFT array substrate provided by an embodiment of the present disclosure, further comprising forming common electrodes on the passivation layer.

At least one embodiment of the present disclosure also provides a thin film transistor (TFT) array substrate, comprising: a base substrate; a gate layer, a gate insulating layer, and an oxide semiconductor layer provided on the base substrate; and a transparent conductive layer and a source/drain electrode layer formed on the oxide semiconductor layer in sequence, the transparent conductive layer contacting the oxide semiconductor layer. The source/drain electrode layer includes source electrodes and drain electrodes. The transparent conductive layer includes pixel electrodes. The source electrodes, the drain electrodes and the pixel electrodes are formed by a single patterning process.

For example, in a TFT array substrate provided by an embodiment of the present disclosure, the source/drain electrode layer is made from a Cu-based metal.

For example, in a TFT array substrate provided by an embodiment of the present disclosure, the oxide semiconductor layer is made from a material including at least one of IGZO, IZO, ZnO or GZO.

For example, in a TFT array substrate provided by an embodiment of the present disclosure, the TFT array substrate further comprises a protective layer provided on the source electrodes and the drain electrodes. The protective layer, the pixel electrodes, the source electrodes, and the drain electrodes are formed by a single patterning process.

At least one embodiment of the present disclosure also provides a display device, comprising any of the TFT array substrates.

BRIEF DESCRIPTION OF THE DRAWINGS in order to demonstrate clearly technical solutions of the embodiments of the present disclosure, the accompanying drawings in relevant embodiments of the present disclosure will be introduced briefly. It is apparent that the drawings may only relate to some embodiments of the disclosure and not intended to limit the present disclosure.

FIG. 1 is a flow chart of a method of manufacturing a TFT array substrate, provided by an embodiment of the present disclosure;

FIG. 2 is a flow chart of a single patterning process in the method of manufacturing the TFT array substrate, provided by an embodiment of the present disclosure;

FIGS. 3 to 12 are process diagrams of the method of manufacturing the TFT array substrate, provided by an embodiment of the present disclosure;

DETAILED DESCRIPTION

Figure 4:
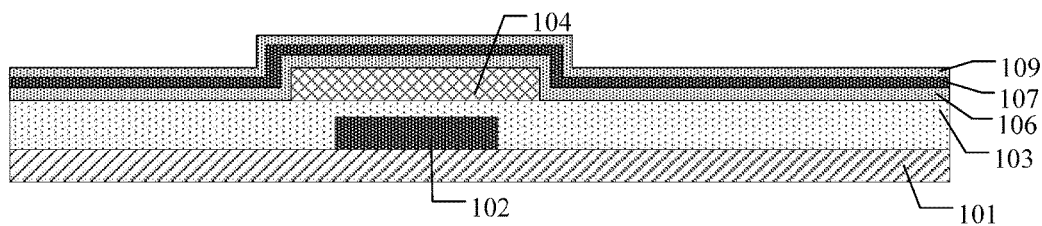

In order to make objects, technical details and advantages of the embodiments of the disclosure apparent, the technical solutions of the embodiment will be described in a clearly and fully understandable way in connection with the drawings related to the embodiments of the disclosure. It is apparent that the described embodiments are just a part but not all of the embodiments of the disclosure. Based on the described embodiments herein, those skilled in the art can obtain other embodiment(s), without any creative work, which shall be within the scope of the disclosure.

Unless otherwise defined, all the technical and scientific terms used herein have the same meanings as commonly understood by one of ordinary skill in the art to which the present disclosure belongs. The terms, such as "first," "second," or the like, which are used in the description and the claims of the present disclosure, are not intended to indicate any sequence, amount or importance, but for distinguishing various components. The terms, such as "comprise/comprising," "include/including," or the like are intended to specify that the elements or the objects stated before these terms encompass the elements or the objects and equivalents thereof listed after these terms, but not preclude other elements or objects. The terms, such as "connect/connecting/connected," "couple/coupling/coupled" or the like, are not limited to a physical connection or mechanical connection, but may include an electrical connection/coupling, directly or indirectly. The terms, "on," "under," or the like are only used to indicate relative position relationship, and when the position of the object which is described is changed, the relative position relationship may be changed accordingly.

For an oxide semiconductor TFTs, if the materials of a source/drain electrode layer are metallic materials, in particular Cu-based metal materials (e.g., Cu or Cu alloy), a buffer layer must be additionally arranged between metal and oxide semiconductors, otherwise, metallic ions will diffuse into the oxide semiconductors, so that the characteristics of the TFTs can be badly affected.

At least one embodiment of the present disclosure provides a method of manufacturing a TFT array substrate, a TFT array substrate manufactured by the manufacturing method, and a display device comprising the TFT array substrate. The method of manufacturing the TFT array substrate comprises: forming a gate layer, a gate insulating layer, an oxide semiconductor layer, a source/drain electrode layer and a transparent conductive layer on a base substrate. The step of forming the source/drain electrode layer and the transparent conductive layer includes: forming a transparent conductive film and a first metallic film in sequence on the oxide semiconductor layer, so as to form a stack layer of the transparent conductive film and the first metallic film, in which the transparent conductive film contacts the oxide semiconductor layer; and forming source electrodes, drain electrodes, and pixel electrodes by performing a single patterning process on the transparent conductive film and the first metallic film.

In the process of manufacturing the TFT array substrate, the source/drain electrode layer and the transparent conductive layer including the pixel electrodes are formed by a single patterning process, and the transparent conductive layer also has a function of preventing metallic ions diffusing into oxide semiconductors. Compared with a method of independently forming a buffer layer, the method reduces one patterning process, which shortens the production time, and reduces the production cost, and in some embodiments, this method can also improve the technique precision and the aperture ratio. The transparent conductive layer includes first parts provided with the pixel electrodes and second parts for preventing the metallic ions from diffusing into the oxide semiconductors. The two parts are simultaneously formed in a same layer and no aligning operation is required, so the alignment precision can be improved. In the manufacturing process, no alignment space is required to be reserved, so that the aperture ratio can be improved.

An embodiment of the present disclosure provides a method of manufacturing a TFT array substrate, for instance, as shown in FIG. 1 which is a flow chart of the method of manufacturing the TFT array substrate, comprises: forming a gate layer, a gate insulating layer, an oxide semiconductor layer, a source/drain electrode layer, and a transparent conductive layer on a base substrate. Herein, the step of forming the source/drain electrode layer and the transparent conductive layer includes: forming a transparent conductive film and a first metallic film in sequence on the oxide semiconductor layer, so as to form a stack layer of the transparent conductive film and the first metallic film, in which the transparent conductive film contacts the oxide semiconductor layer; and forming source electrodes, drain electrodes and pixel electrodes by performing a single patterning process on the stack layer of the transparent conductive film and the first metallic film.

For instance, the first metallic film is made from a material of Cu-based metals. Cu-based metals have characteristics of low electric resistivity and good electric conductivity, and can improve the signal transmission rate of the source electrodes and the drain electrodes and improve the display quality.

For instance, the Cu-based metals are Cu, CuZn, CuNi, CuZnNi, or any other Cu-based metal alloy with stable performances.

For instance, the thickness of the first metallic film may be 200-400 nm, for instance, 200 nm, 230 nm, 250 nm, 300 nm, 350 nm, 380 nm, or 400 nm.

For instance, the transparent conductive film is made from a material of ITO, IZO, indium gallium oxide (IGO), GZO, carbon nanotubes, or the like. The transparent conductive film is made from a material of ZnO, indium oxide ($In_2O_3$), aluminum-doped zinc oxide (AZO), or the like.

For instance, the transparent conductive film may be deposited by magnetron sputtering, and the thickness of the transparent conductive film may be 30-50 nm, for instance, 30 nm, 40 nm or 50 nm.

For instance, the oxide semiconductor layer is made from a material of IGZO, IZO, ZnO, GZO, or the like.

For instance, the oxide semiconductor layer may be formed by deposition via magnetron sputtering, and the thickness of the oxide semiconductor layer may be 30-50 nm, for instance, it may be 30 nm, 40 nm or 50 nm.

For instance, the single patterning process includes a photolithography process using a gray-tone mask, or a half-tone mask. For instance, FIG. 2 is a flow chart of a single patterning process in the method of manufacturing the TFT array substrate, provided by an embodiment of the present disclosure. The single patterning process includes the following steps: coating photoresist on a first metallic film; performing exposure and development on the photoresist and forming photoresist-completely-retained regions, photoresist-partly-retained regions and photoresist-removed regions; removing a transparent conductive film and the first metallic film in the photoresist-removed regions by a first etching process; removing the photoresist in the photoresist-partly-retained regions by an ashing process; removing the first metallic film in the photoresist-partly-retained regions by a second etching process, and forming pixel electrodes; and stripping off the photoresist in the photoresist-completely-retained regions and forming source electrodes and drain electrodes. Herein, the photoresist-completely-retained regions correspond to regions where the source electrodes and the drain electrodes are formed; the photoresist-partly-retained regions correspond to regions where the pixel electrodes are formed; and the photoresist-removed regions are areas other than the photoresist-completely-retained regions and the photoresist-partly-retained regions.

For instance, a first etching solution used in the first etching process and a second etching solution used in the second etching process both include $H_2O_2$, and the concentration of $H_2O_2$ in the first etching solution is greater than the concentration of $H_2O_2$ in the second etching solution. For instance, the composition of the first etching solution and the second etching solution may include hydrogen fluoride (HF), $H_2O_2$ and deionized water ($H_2O$). For instance, in the first etching solution, the mass percentage of $H_2O_2$ is 20%, the mass percentage of HF is 1%, and the mass percentage of $H_2O$ being 79%; and in the second etching solution, the mass percentage of $H_2O_2$ is 10%, the mass percentage of HF is 1%, and the mass percentage of $H_2O$ is 89%.

For instance, to overcome defects of instable etching speed and non-uniform etching process due to $H_2O_2$ decomposition. The $HF/H_2O_2$ etching solution may also include an etching solution stabilizer with the mass percentage of 0.2%-1%. For instance, the etching solution stabilizer includes: alcohols with the mass percentage of 3%-6%, for instance 5%, in which the alcohols may be monohydric alcohol, dihydric alcohol, or polyhydric alcohol, for instance, methanol, ethanol, propanol, 1,4-butanediol, ethylene glycol, or normal butanol; organic amines with the mass percentage of 10%-15%, for instance, 13%, in which the organic amines may, for instance, be one or more selected from monoamine, diamine, and polyamine, for instance, methylamine, ethylamine, aniline, benzylamine, triethylene diamine, or triethylamine; sulfonic acid compounds with the mass percentage of 2%-5%, for instance, 5%, in which the sulfonic acid compounds may, for instance, be one or more selected from alkyl sulfonic acid, aryl sulfonic acid, or aminosulfonic acid, for instance, cyclohexane sulfonic acid, aminosulfonic acid, cyclopropanesulfonic acid, cyclohexylamine sulfonic acid, or paratoluenesulfonic acid; and water with the mass percentage of 40%-85%, for instance, 77%, in which the water may, for instance, be deionized water.

For instance, in the first etching solution, the mass percentage of $H_2O_2$ is 20%, the mass percentage of HF is 1%, the mass percentage of $H_2O$ is 78%, and the mass percentage of the etching solution stabilizer is 1%; and in the second etching solution, the mass percentage of $H_2O_2$ is 10%, the mass percentage of HF is 1%, the mass percentage of $H_2O$ is 88%, and the mass percentage of the etching solution stabilizer is 1%.

For instance, in one example, a protective layer film may also be formed on the first metallic film. The protective layer film can protect the first metallic film from being oxidized in subsequent processes, so as to ensure the electrical conductivity. In this way the signal transmission rate of the source electrodes and the drain electrodes formed by the first metallic film is increased, and the display quality is improved.

In the example, for instance, the transparent conductive film, the first metallic film and the protective layer film are sequentially and continuously deposited; then, the transparent conductive film, the first metallic film and the protective layer film are subjected to a single patterning process to form a three-layer stack structure including the pixel electrodes, the source/drain electrodes and the protective layer. This single patterning process can reduce two film forming processes and two etching processes. The method prevents the first metallic film from being oxidized, and prevents Cu ions in the first metallic film from diffusing into the oxide semiconductor layer. The production time is shortened, and the production cost is reduced, and the process precision and the aperture ratio are improved.

For instance, the protective layer film may be made from conductive materials, such as ITO, IZO, IGZO, GZO, and carbon nanotubes. The protective layer film not only need to protect the first metallic film from being oxidized but also need to guarantee certain electrical conductivity, because a through hole structure formed by etching the first metallic film need to be electrically connected, the protective layer film covering the through hole structure is required to have electrical conductivity.

For instance, FIGS. 3 to 12 are diagrams illustrating the processes of the method of manufacturing the TFT array substrate, provided by an embodiment of the present disclosure. For instance, description is given by taking the case that TFTs in the TFT array substrate are bottom-gate TFTs as an example.

For instance, as shown in FIG. 3, a gate layer 102, a gate insulating layer 103 and an oxide semiconductor layer 104 are formed on a base substrate 101 in sequence before a step of forming pixel electrodes, source electrodes and drain electrodes. For instance, the forming process is described as below.

A gate metal layer (not shown) is deposited on the base substrate 101; one layer of photoresist (not shown) is coated on the gate metal layer; and a pattern of the gate layer 102 is formed by processes including exposure, development, etching and photoresist stripping processes.

Secondly, a gate insulating layer film is deposited on the base substrate 101 provided with the gate layer 102; one layer of photoresist (not shown) is coated on the gate insulating layer film; and pattern of the gate insulating layer 103 is formed by processes including exposure, development, etching and photoresist stripping processes.

Thirdly, an oxide semiconductor layer film is deposited on the base substrate 101 provided with the gate layer 102 and the gate insulating layer 103; one layer of photoresist (not shown) is coated on the oxide semiconductor layer film; and patterns of the oxide semiconductor layer 104 are formed by processes such as exposure, development, etching and photoresist stripping.

For instance, the material of the gate metal layer may be a combination of Cu and other metals, for instance, copper/molybdenum alloy (Cu/Mo), copper/titanium alloy (Cu/Ti), copper/molybdenum titanium alloy (Cu/MoTi), copper/molybdenum tungsten alloy (Cu/MoW), or copper/molybdenum niobium alloy (Cu/MoNb); and the material of the gate metal layer may also be chrome (Cr)-based metal or a combination of Cr and other metals, for instance, chrome/molybdenum alloy (Cr/Mo), chrome/titanium alloy (Cr/Ti), or chrome/molybdenum titanium alloy (Cr/MoTi).

For instance, the material of the gate insulating layer film includes silicon nitride ($SiN_x$, x is a natural number), silicon oxide ($SiO_x$, x is a natural number), aluminum oxide ($Al_2O_3$), aluminum nitride (AlN), or other suitable materials.

For instance, the photoresist may be coated by spin coating, blade coating, or roller coating.

For instance, as shown in FIG. 4, a transparent conductive film 106, a first metallic film 107, and a protective layer film 109 are sequentially deposited on the base substrate 101 on which the gate layer 102, the gate insulating layer 103, and the oxide semiconductor layer 104 are formed in sequence.

Figure 5:
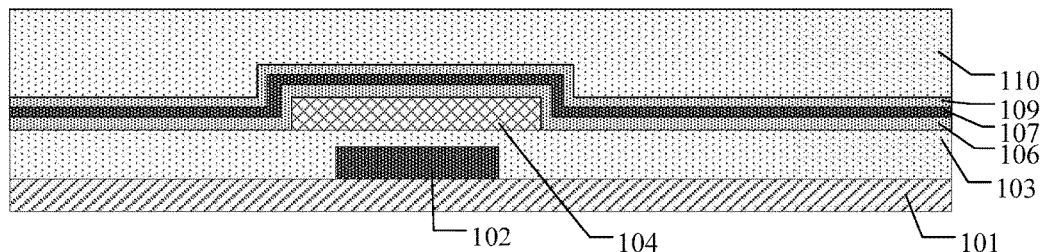

For instance, as shown in FIG. 5, photoresist 110 is coated on the protective layer film 109.

Figure 6:
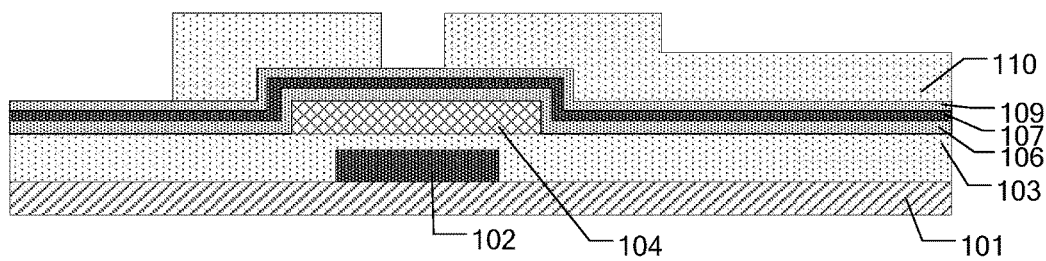

For instance, as shown in FIG. 6, the photoresist 110 is subjected to exposure and development to form photoresist-completely-retained regions, photoresist-partly-retained regions, and photoresist-removed regions.

Figure 7:
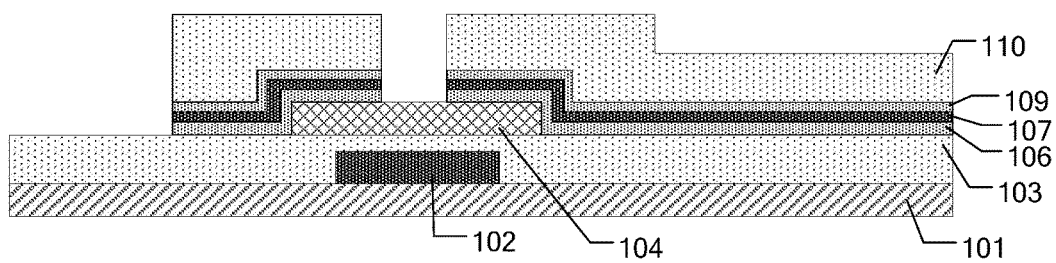

For instance, as shown in FIG. 7, the transparent conductive film 106, the first metallic film 107, and the protective layer film 109 in the photoresist-removed regions are removed by a first etching process.

Figure 8:
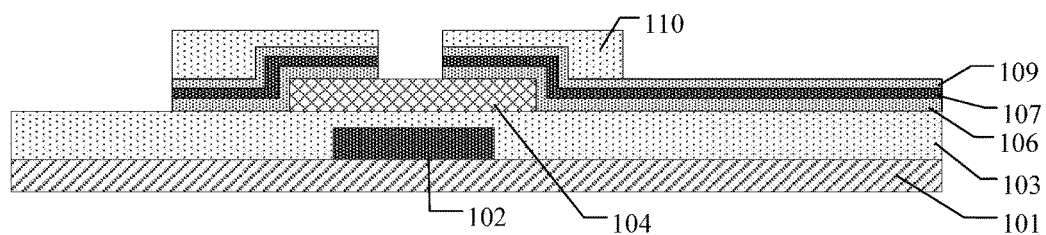

For instance, as shown in FIG. 8, the photoresist in the photoresist-partly-retained regions is removed by an ashing process, meanwhile, the thickness of the photoresist in the photoresist-completely-retained regions is also reduced.

Figure 9:
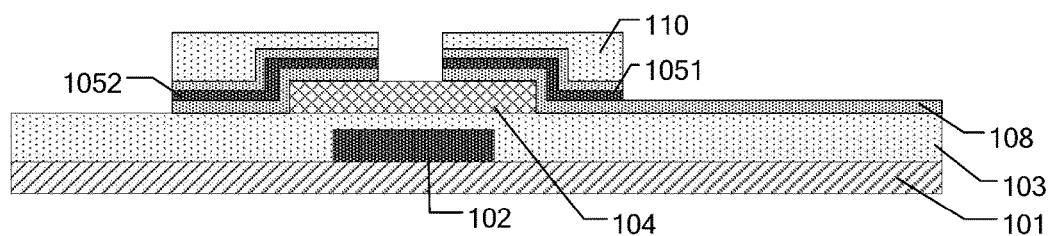

For instance, as shown in FIG. 9, the protective layer film 109 and the first metallic film 107 in the photoresist-partly-retained regions are removed by a second etching process, and pixel electrodes 108 are formed.

Figure 10:
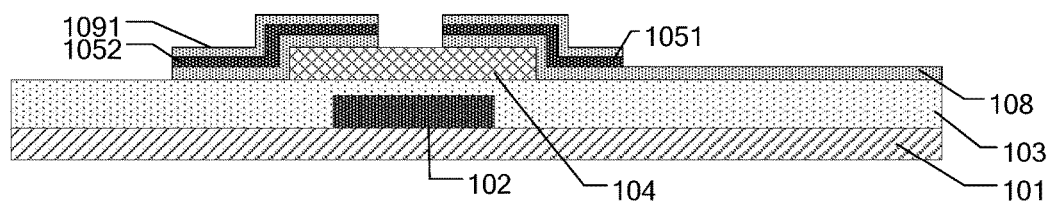

For instance, as shown in FIG. 10, the photoresist 110 in the photoresist-completely-retained regions is stripped off, and source electrodes 1051, drain electrodes 1052, and a protective layer 1091 are formed.

For instance, the photoresist-completely-retained regions correspond to regions where the source electrodes 1051 and the drain electrodes 1052 are formed; the photoresist-partly-retained regions correspond to regions where the pixel electrodes 108 are formed; and the photoresist-removed regions are areas other than the photoresist-completely-retained regions and the photoresist-partly-retained regions.

Figure 11:
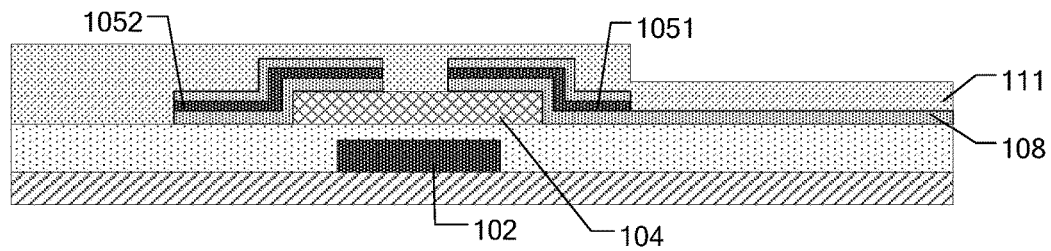

For instance, as shown in FIG. 11, in the embodiment, the method of manufacturing the TFT array substrate further comprises forming a passivation layer 111 to cover the pixel electrodes 108, the source electrodes 1051, the drain electrodes 1052, the gate layer 102, the gate insulating layer 103, and the oxide semiconductor layer 104. The passivation layer 111 may have functions of protection and insulation. For instance, the material of the passivation layer 111 may be silicon nitride ($SiN_x$, x is a natural number), silicon oxide ($SiO_x$, x is a natural number), acrylic resin, or the like.

Figure 12:
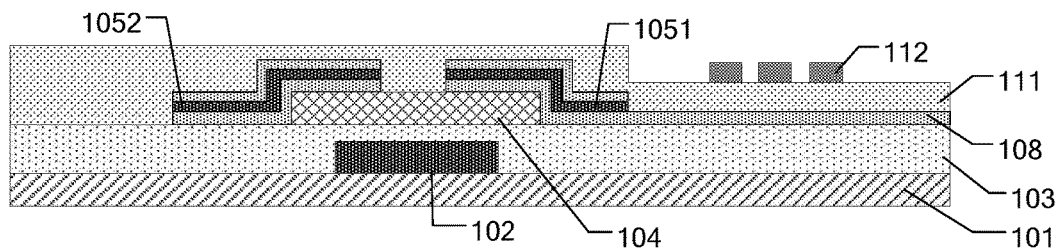

For instance, as shown in FIG. 12, in the embodiment, the method of manufacturing the TFT array substrate further comprises forming common electrodes 112 on the passivation layer 111. The common electrodes 112 may also be formed in the previous steps of forming the gate layer, the source electrodes, etc. In the operation, a voltage is applied to the common electrodes 112, and capacitance may be formed between the common electrodes and the pixel electrodes 108, to allow liquid crystal molecules to be deflected. When the common electrodes are formed, structures, such as a connecting circuit for connecting circuits disconnected at a through hole structure, may also be formed simultaneously.

For instance, the TFTs in the TFT array substrate are top-gate TFTs. The oxide semiconductor layer is formed before the step of forming the pixel electrodes, the source electrodes, and the drain electrodes; and the gate insulating layer, and the gate layer are sequentially formed after the step of forming the pixel electrodes, the source electrodes, the drain electrodes, and the oxide semiconductor layer.

Figure 13:
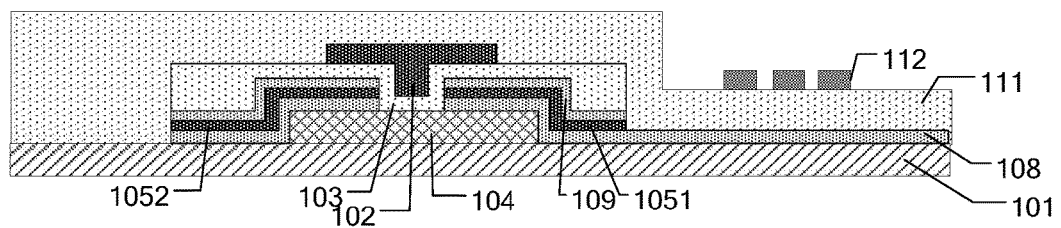
FIG. 13 is a schematic diagram of a TFT array substrate manufactured by another manufacturing method, provided by an embodiment of the present disclosure.

For instance, as shown in FIG. 13, the TFTs in the TFT array substrate are top-gate TFTs. The oxide semiconductor layer 104 is formed on the base substrate 101; and the pixel electrodes 108, the source electrodes 1051, the drain electrodes 1052, the gate insulating layer 103, the gate layer 102, the passivation layer 111, and the common electrodes 112 are formed on the oxide semiconductor layer 104. The specific forming processes of the various layer structures may refer to the bottom-gate TFT array substrate, no further description will be given here.

Figure 14:
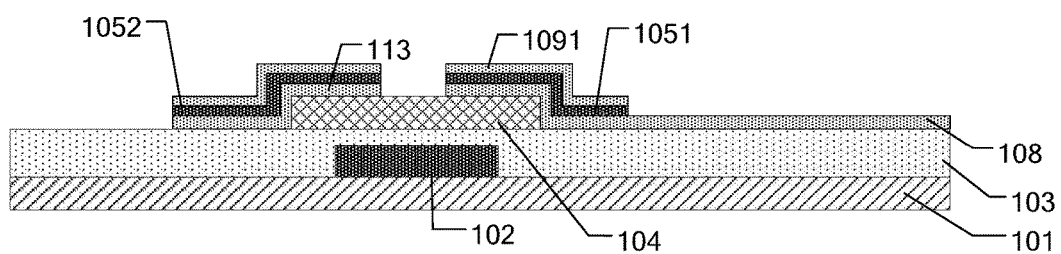
FIG. 14 is a schematic diagram of a TFT array substrate provided by an embodiment of the present disclosure.

The embodiment of the present disclosure also provides a TFT array substrate, which is manufactured by any of the methods of manufacturing the TFT array substrate. For instance, FIG. 14 illustrates a TFT array substrate provided by an embodiment of the present disclosure. The TFT array substrate comprises: a base substrate 101; a gate layer 102, a gate insulating layer 103, and an oxide semiconductor layer 104 disposed on the base substrate 101; and a transparent conductive layer 113 and a source/drain electrode layer sequentially formed on the oxide semiconductor layer 104, in which the transparent conductive layer 113 contacts the oxide semiconductor layer 104. The source/drain electrode layer includes source electrodes 1051 and drain electrodes 1052. The transparent conductive layer 113 includes pixel electrodes 108. The source electrodes 1051, the drain electrodes 1052, and the pixel electrodes 108 are formed by a single patterning process.

For instance, TFTs in the TFT array substrate 101 may be bottom-gate TFTs, or top-gate TFTs.

For instance, the source/drain electrode layer is made from a Cu-based metal. The Cu metal has the characteristics of low electric resistivity and good electrical conductivity, so that it can improve the signal transmission rate of the source electrodes and the drain electrodes and improve the display quality.

For instance, the Cu-based metal is Cu, or Cu-based metal alloy with stable performances, such as CuZn, CuNi, or CuZnNi.

For instance, the thickness of the source/drain electrode layer may be 200-400 nm, for instance, 200 nm, 230 nm, 250 nm, 300 nm, 350 nm, 380 nm, or 400 nm.

For instance, the material of the oxide semiconductor layer 104 is IGZO, IZO, ZnO, GZO, or the like.

For instance, the oxide semiconductor layer 104 may be deposited by magnetron sputtering, and the thickness of the oxide semiconductor layer may be 30-50 nm, for instance, 30 nm, 40 nm, or 50 nm.

For instance, as shown in FIG. 14, the TFT array substrate further comprises: a protective layer 1091 disposed on the source electrodes 1051 and the drain electrodes 1052, in which the protective layer 1091, and the pixel electrodes 108, the source electrodes 1051 and the drain electrodes 1052 are formed by a single patterning process, namely a three-layer stack structure including the pixel electrodes 108, the source electrodes 1051, the drain electrodes 1052 and the protective layer 1091 is formed. The single patterning process can reduce two film forming processes and two etching processes. The three-layer stack structure prevents the first metallic film from being oxidized, and prevents Cu ions in the first metallic film from diffusing into the oxide semiconductor layer. The production time is shortened, the production cost is reduced, and the process precision and the aperture ratio are improved.

The embodiment of the present disclosure also provides a display device, which comprises the TFT array substrate. The display device may be: any product or component with display function, such as a liquid crystal display (LCD) panel, e-paper, an organic light-emitting diode (OLED) panel, a mobile phone, a tablet PC, a television, a display, a notebook computer, a digital picture frame, or a navigator.

Embodiments of the present disclosure provide a TFT array substrate, a manufacturing method thereof, and a display device. In the manufacturing process of the TFT array substrate, the source/drain electrode layer and the transparent conductive layer including the pixel electrodes are formed by a single patterning process, and the transparent conductive layer also has a function of preventing metallic ions (particularly Cu ions) from diffusing into the oxide semiconductors. Compared with the method of independently forming a buffer layer, the method reduces one patterning process, shortens the production time, reduces the production cost, and improves the process precision and the aperture ratio.

Several points to be noted:

(1) The drawings of the embodiments of the present disclosure may only involve structures to which the embodiments of the present disclosure relate, and other structures can refer to general design;

(2) For clarity, in the accompanying drawings for illustrating the embodiments of the present disclosure, the thickness of layers or regions is enlarged or reduced, namely the accompanying drawings are not drawn according to actual scales. It should be understood that: when an element, such as a layer, a film, a region or a substrate, is described to be disposed "on," or "beneath" another element, the element may be "directly" disposed "on," or "beneath" another element, or an intermediate element may be provided.

(3) The embodiments of the present disclosure and the characteristics in the embodiments may be combined to obtain new embodiments without conflict.

The foregoing is only the specific embodiments of the present disclosure and not intended to limit the scope of the present disclosure. The scope of the present disclosure shall be defined by the appended claims.

The present application claims priority to the Chinese patent application No. 201610279966.2, filed on Apr. 28, 2016, the disclosure of which is incorporated herein by reference as part of the application.

What is claimed is:

1. A method of manufacturing a thin-film transistor (TFT) array substrate, comprising:
    forming a gate layer, a gate insulating layer, an oxide semiconductor layer, a source/drain electrode layer and a transparent conductive layer on a base substrate,
    wherein the forming of the source/drain electrode layer and the transparent conductive layer includes:
        forming a transparent conductive film and a first metallic film on the oxide semiconductor layer in sequence, to form a stack layer of the transparent conductive film and the first metallic film, in which the transparent conductive film contacts the oxide semiconductor layer;
        forming source electrodes, drain electrodes and pixel electrodes by performing a single patterning process on the stack layer of the transparent conductive film and the first metallic film; and
        forming a protective layer film on the first metallic film, and forming the pixel electrodes, the source electrodes, the drain electrodes, and the protective layer by performing a single patterning process on the transparent conductive film, the first metallic film, and the protective layer film;
    wherein the protective layer film includes at least one of ITO IZO, IGZO, GZO, or carbon nanotube conductive films.

2. The method of manufacturing the TFT array substrate according to claim 1, wherein the first metallic film is made from copper, or a copper (Cu)-based alloy.

3. The method of manufacturing the TFT array substrate according to claim 2, wherein the Cu-based alloy is copper-zinc alloy (CuZn), copper-nickel alloy (CuNi), or copper-zinc-nickel alloy (CuZnNi).

4. The method of manufacturing the TFT array substrate according to claim 1, wherein the transparent conductive film is made from a material including at least one of indium tin oxide (ITO), indium zinc oxide (IZO), gallium zinc oxide (GZO), or carbon nanotubes.

5. The method of manufacturing the TFT array substrate according to claim 1, wherein the oxide semiconductor layer is made from a material including at least one of indium gallium zinc oxide (IGZO), IZO, zinc oxide (ZnO), or GZO.

6. The method of manufacturing the TFT array substrate according to claim 1, wherein the single patterning process includes a photolithography process using a gray-tone mask, or a half-tone mask.

7. A method of manufacturing a TFT array substrate, comprising,
forming a gate layer, a gate insulating layer, an oxide semiconductor layer, a source/drain electrode layer and a transparent conductive layer on a base substrate,
wherein the forming of the source/drain electrode layer and the transparent conductive layer includes:
forming a transparent conductive film and a first metallic film on the oxide semiconductor layer in sequence, to form a stack layer of the transparent conductive film and the first metallic film, in which the transparent conductive film contacts the oxide semiconductor layer;
forming source electrodes, drain electrodes and pixel electrodes by performing a single patterning process on the stack layer of the transparent conductive film and the first metallic film,
wherein the single patterning process includes:
coating photoresist on the first metallic film;
forming photoresist-completely-retained regions, photoresist-partly-retained regions and photoresist-removed regions by performing an exposure process, and a developing process on the photoresist;
removing the transparent conductive film and the first metallic film in the photoresist-removed regions by a first etching process;
removing the photoresist in the photoresist-partly-retained regions by an ashing process;
removing the first metallic film in the photoresist-partly-retained regions by a second etching process, and forming the pixel electrodes; and
stripping off the photoresist in the photoresist-completely-retained regions, and forming the source electrodes and the drain electrodes;
wherein the photoresist-completely-retained regions correspond to regions where the source electrodes and the drain electrodes are formed; the photoresist-partly-retained regions correspond to regions where the pixel electrodes are formed; and the photoresist-removed regions are regions other than the photoresist-completely-retained regions and the photoresist-partly-retained regions.

8. The method of manufacturing the TFT array substrate according to claim 7, wherein a first etching solution used in the first etching process and a second etching solution used in the second etching process both include hydrogen peroxide ($H_2O_2$), and a concentration of $H_2O_2$ in the first etching solution is greater than that of $H_2O_2$ in the second etching solution.

9. The method of manufacturing the TFT array substrate according to claim 6, wherein TFTs are bottom-gate TFTs; and the gate layer, the gate insulating layer and the oxide semiconductor layer are sequentially formed before the pixel electrodes, the source electrodes and the drain electrodes are formed.

10. The method of manufacturing the TFT array substrate according to claim 6, wherein the TFTs are top-gate TFTs; the oxide semiconductor layer is formed before the pixel electrodes, the source electrodes, the drain electrodes, and the protective layer are formed; and the gate insulating layer and the gate layer are sequentially formed after the pixel electrodes, the source electrodes, the drain electrodes, and the oxide semiconductor layer are formed.

11. The method of manufacturing the TFT array substrate according to claim 9, further comprising:
forming a passivation layer to cover the pixel electrodes, the source electrodes, the drain electrodes, the gate layer, the gate insulating layer, and the oxide semiconductor layer.

12. The method of manufacturing the TFT array substrate according to claim 11, further comprising:
forming common electrodes on the passivation layer.

13. The method of manufacturing the TFT array substrate according to claim 7, wherein the first metallic film is made from copper-zinc alloy (CuZn), copper-nickel alloy (CuNi), or copper-zinc-nickel alloy (CuZnNi).

14. The method of manufacturing the TFT array substrate according to claim 7, wherein the single patterning process is performed by using a gray-tone mask, or a half-tone mask.

15. The method of manufacturing the TFT array substrate according to claim 7, wherein the transparent conductive film is made from a material including at least one of indium tin oxide (ITO), indium zinc oxide (IZO), gallium zinc oxide (GZO), or carbon nanotubes.

* * * * *